US008816750B2

(12) United States Patent
Vavelidis

(10) Patent No.: US 8,816,750 B2
(45) Date of Patent: Aug. 26, 2014

(54) HIGH FREQUENCY MIXER WITH TUNABLE DYNAMIC RANGE

(71) Applicant: Broadcom Corporation, Irvine, CA (US)

(72) Inventor: Konstantinos Vavelidis, Athens (GR)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/781,379

(22) Filed: Feb. 28, 2013

(65) Prior Publication Data

US 2013/0222041 A1 Aug. 29, 2013

Related U.S. Application Data

(63) Continuation of application No. 10/623,097, filed on Jul. 17, 2003, now abandoned.

(60) Provisional application No. 60/396,454, filed on Jul. 17, 2002.

(51) Int. Cl.
*G06F 7/44* (2006.01)
*G06G 7/16* (2006.01)

(52) U.S. Cl.
USPC ............ 327/358; 455/326; 455/333; 327/359

(58) Field of Classification Search
USPC ......... 327/115, 116, 117, 118, 355–361, 202, 327/203, 208–212, 218; 377/47, 48
See application file for complete search history.

(56) References Cited

U.S. PATENT DOCUMENTS

| 5,392,003 | A | * | 2/1995 | Nag et al. ...................... 330/254 |
| 5,613,233 | A | * | 3/1997 | Vagher ........................... 455/296 |
| 5,625,307 | A | * | 4/1997 | Scheinberg ..................... 327/113 |
| 5,768,700 | A | | 6/1998 | Kardontchik |
| 5,878,332 | A | | 3/1999 | Wang et al. |
| 5,881,369 | A | | 3/1999 | Dean et al. |
| 6,138,000 | A | | 10/2000 | Navid et al. |
| 6,242,963 | B1 | | 6/2001 | Su et al. |
| 7,280,815 | B2 | * | 10/2007 | Pellat et al. .................... 455/326 |
| 7,536,165 | B2 | * | 5/2009 | Redman-White ............. 455/333 |
| 7,917,120 | B1 | * | 3/2011 | Gilbert ........................... 455/333 |
| 2001/0021645 | A1 | | 9/2001 | Ugajin et al. |
| 2001/0046881 | A1 | | 11/2001 | Kim |
| 2003/0109238 | A1 | * | 6/2003 | Kim et al. ...................... 455/293 |
| 2003/0169089 | A1 | | 9/2003 | Manku et al. |
| 2004/0176064 | A1 | | 9/2004 | Mattisson |
| 2004/0219898 | A1 | | 11/2004 | Bult et al. |

(Continued)

OTHER PUBLICATIONS

Office Action mailed Nov. 17, 2005 for U.S. Appl. No. 10/623,097.

*Primary Examiner* — Brandon S Cole
(74) *Attorney, Agent, or Firm* — Sterne, Kessler, Goldstein & Fox P.L.L.C.

(57) ABSTRACT

A high frequency mixer with a tunable dynamic range is disclosed. One embodiment provides a mixer apparatus including multiple first transistors at an input branch that receive a differential radio frequency (RF) signal, and multiple second transistors at a second branch that receive a differential local oscillator (LO) signal. The second transistors generate an intermediate frequency (IF) differential output signal. The bias current that flows at the input branch and the output branch can be independently adjusted to allow the conversion gain, linearity, or the output noise of the mixer to be controlled.

20 Claims, 4 Drawing Sheets

(56) References Cited

U.S. PATENT DOCUMENTS

| | | | |
|---|---|---|---|
| 2008/0160950 A1* | 7/2008 | Yang et al. | 455/326 |
| 2008/0305759 A1* | 12/2008 | Tervaluoto et al. | 455/326 |
| 2009/0075621 A1* | 3/2009 | Christoffers et al. | 455/333 |
| 2010/0029234 A1* | 2/2010 | Joos et al. | 455/209 |
| 2012/0196555 A1* | 8/2012 | Igarashi et al. | 455/341 |

\* cited by examiner

HIGH FREQUENCY MIXER WITH TUNABLE DYNAMIC RANGE

CROSS REFERENCE TO RELATED APPLICATIONS

The present application is a continuation of U.S. patent application Ser. No. 10/623,097, filed Jul. 17, 2003, now abandoned, which claims the benefit of U.S. Provisional Patent Application No. 60/396,454, filed Jul. 17, 2002, and entitled, "CMOS RF Mixer with Tunable Dynamic Range and Combined RF Switch." Each of the above referenced applications is incorporated herein by reference in its entirety.

BACKGROUND OF THE INVENTION

1. Field of the Invention

The present invention relates to high frequency mixers, and more particularly to radio frequency mixers used in communication receivers and other devices.

2. Background Art

Analog multipliers or mixers are typically used in a wide range of communication applications to, for example, up-convert a baseband analog or digital signal for ease of transmission, or down-convert a high frequency signal to baseband for ease of signal processing. For example, in a down-conversion scenario, the mixer can be used in a receiver that receives high frequency signals (such as radio frequency (RF) signals) to provide a signal at a lower intermediate frequency that can then be processed and demodulated by the receiver, e.g. into digital data. The mixer uses a local oscillator (LO) signal that is input to mix with the received high frequency signal to achieve the intermediate frequency signal.

A Gilbert cell mixer is often used in high frequency receivers, since this type of mixer provides reasonable conversion gain (intermediate frequency (IF) power output with respect to the RF power input), good rejection at the RF and LO ports, and a differential IF output connection. A Gilbert cell mixer can be advantageously implemented in CMOS as a straightforward translation of a bipolar Gilbert cell.

FIG. 1 is a schematic diagram of an example of a prior art fully-differential Gilbert cell mixer 10 implemented using CMOS devices. When used as a down converter (from RF to intermediate frequencies), its operation is generally as follows. The voltage from the oscillating RF signal unbalances the current so that the current flip-flops back and forth between the two devices 12a and 12b. Devices 14a and 14c are "open" when devices 14b and 14d are "closed," and then this reverses, with devices 14a and 14c "closed" while devices 14b and 14d are "open." The switching of the devices occurs back and forth at a rate determined by the frequency of the LO signal. These switches direct the AC currents of the LO from devices 12a and 12b to the output load, half the time to one port at the load, and half the time to the other port at the load. This non-linear process produces many frequencies; one of the more prominent frequencies produced is approximately the sum of the RF and LO frequencies, while another prominent frequency is approximately the difference of these frequencies. One of these can be the desired intermediate frequency (IF). Even if devices 14a-14d do not act as switches, the mixer still can produce the desired intermediate frequency, since two of the devices 14a-d will direct more current during on window of time and less current during the alternate window. The load 16 can be an active load or a passive load.

This type of mixer suffers from some undesirable characteristics or disadvantages. Gilbert cells provide a low noise figure, but at the expense of a very low linearity, which figure, can be undesirable in some applications. Another disadvantage is that, when the input transistors 12a and 12b that receive the RF signal are biased at high current, this results in high transconductance and thus high conversion gain. The devices 14a-d that receive the local oscillator (LO) signal exhibit high gate-to-source voltage as a result. This, in turn, disturbs the switching action of those devices 14a-d, which gives rise to distortion and noise.

Another disadvantage is that the noise performance of the Gilbert cell mixer at low frequencies is dominated by the noise that arises due to switching action at the devices 14a-d which receive the LO signal. NMOS switching devices operating at high bias currents, and thus high gate-to-source voltage, exhibit increased output noise. Low noise performance, especially at low frequencies, e.g., at the output of a down-converting mixer, is very critical in receiver architectures, especially in direct conversion architectures, so that the prior art designs may be undesirable in many applications.

BRIEF SUMMARY OF THE INVENTION

The invention provides a high frequency mixer with a tunable dynamic range. In one aspect of the present invention, a mixer apparatus includes multiple first transistors at an input branch that receive a differential radio frequency (RF) signal, and multiple second transistors at a second branch that are coupled to the first transistors and that receive a differential local oscillator (LO) signal. The second transistors generate an intermediate frequency (IF) differential output signal which is the mixing product of RF and LO signals. The bias current that flows at the input branch and the output branch can be independently adjusted to allow the conversion gain, linearity, or the output noise of the mixer to be controlled.

In another aspect of the present invention a mixer apparatus includes multiple NMOS transistors at an input branch that receive a differential radio frequency (RF) signal, multiple PMOS transistors at a second branch that are coupled to the first transistors and that receive a differential local oscillator (LO) signal and generate an intermediate frequency (IF) differential output signal which is the mixing product RF and LO signals. Multiple current sources are also included, which provide the bias current for the NMOS transistors and the PMOS transistors.

In another aspect of the present invention, a method is described for mixing an input radio frequency (RF) signal with a local oscillator (LO) signal using a mixer to produce a down-converted output signal having an intermediate frequency. The method includes receiving the RF signal differentially at a plurality of first transistors of an input branch of the mixer, receiving the differential LO signal at a plurality of second transistors of a second branch of the mixer, and generating the intermediate frequency (IF) differential output signal which is the mixing product of RF and LO signals. The bias current that flows at the input branch and the output branch can be independently adjusted to allow the conversion gain, linearity, or the output noise of the mixer to be controlled.

The present invention provides a mixer having a tunable dynamic range. This allows the characteristics and performance of the mixer to be adjusted based on the frequency of the input RF signal and other parameters, and decreases the noise and distortion in the signal output from the mixer. Furthermore, the mixer of the present invention is well-suited to provide low noise and high speed performance Tier multi-band applications involving different input RF frequencies.

BRIEF DESCRIPTION OF THE DRAWINGS/FIGURES

DETAILED DESCRIPTION OF THE INVENTION

The present invention relates to a high frequency mixer with a tunable dynamic range. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiments shown but is to be accorded the widest scope consistent with the principles and features described herein.

Embodiments and examples of the present invention are described below. While particular applications and methods are explained, it should be understood that the present invention can be used in a wide variety of other applications and with other techniques within the scope of the present invention.

The present invention provides a mixer suitable for high-frequency radio frequency (RF) receivers. The mixer of the present invention provides a continuously or discretely or digitally tunable dynamic range and low noise performance, especially low flicker noise performance. The mixer of the present invention has additional advantages, including process tolerant implementation in highly integrated digitally calibrated receivers; applicability in a wide range of wireless or analog applications, especially in multi-band implementations; and a combined RF switch which offers extra tuning flexibility in controlling the mixer characteristics.

In one described embodiment, the mixer can be implemented with complementary metal-oxide semiconductor (CMOS) components, although other types of components can be used in other embodiments. For example, bipolar transistors can be used in the mixer in an alternate embodiment (flicker noise is typically not an issue using such transistors).

Figure 1:
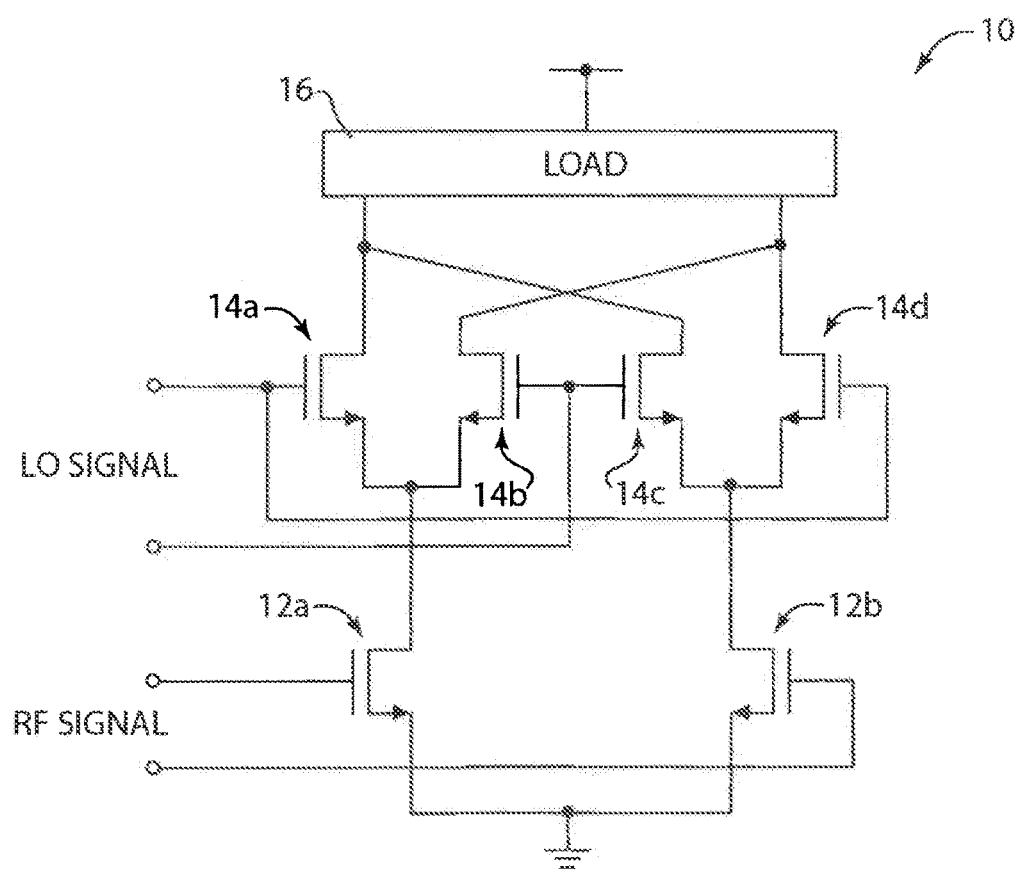
FIG. 1 is a schematic diagram illustrating a prior art Gilbert cell mixer.
Figure 2:
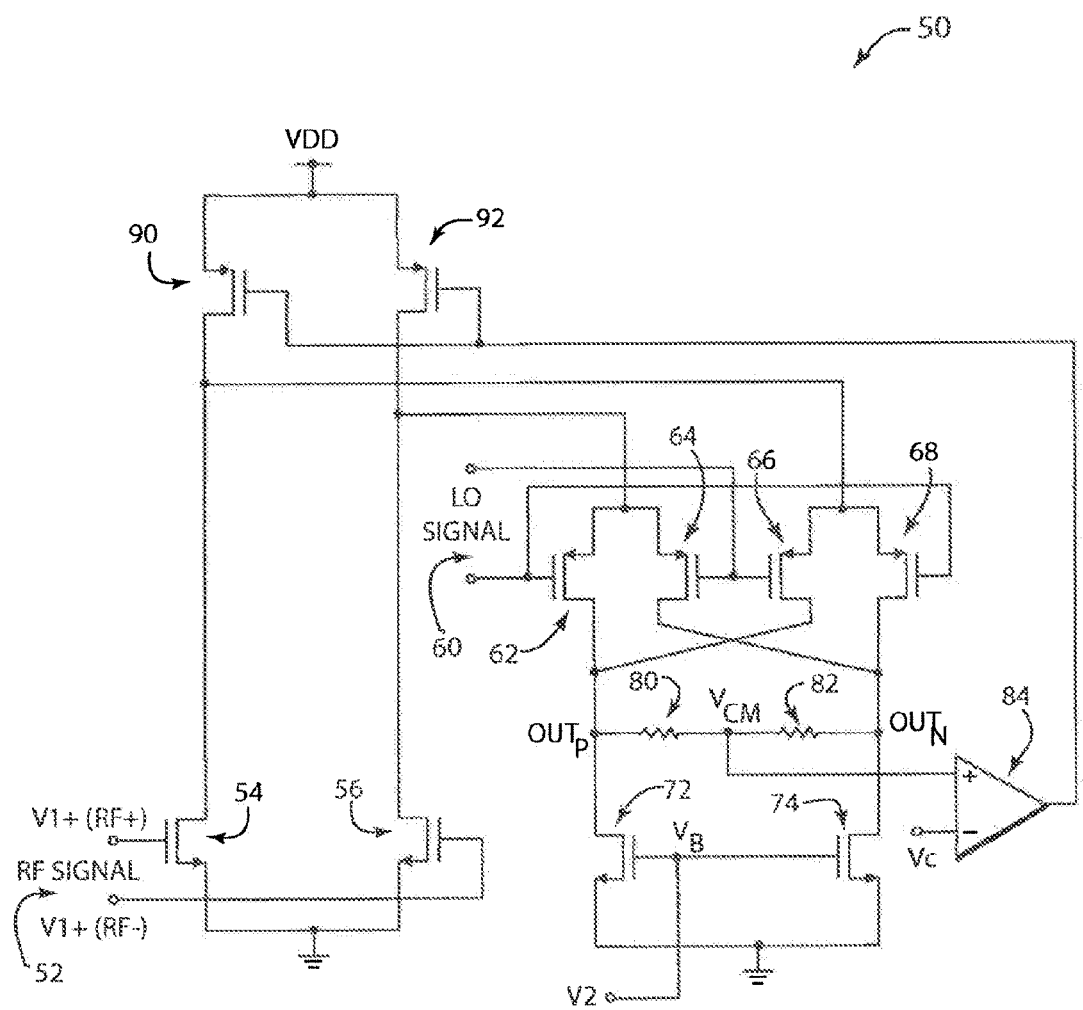
FIG. 2 is a schematic diagram illustrating one embodiment of a mixer of the present invention.

FIG. 2 is a schematic diagram of a preferred embodiment 50 of a mixer of the present invention that overcomes the drawbacks of prior art mixers. Mixer 50 includes an RF signal input port 52 which is differentially connected to the gates of NMOS transistor devices 54 and 56, where the positive RF input is connected to device 54 and the negative RF input is connected to device 56. The devices 54 and 56 are considered an RF input branch, and are connected between ground at one node and the drains of devices 90 and 92 and the sources of devices 62-68 at the other node (described below). The RF signal to the mixer 50 is input at the input port 52. A bias DC voltage V1 is applied at the RF input port 52 to set the level of bias current in the RF input branch (V1 is independent of the AC voltage of the RF signal).

Mixer 50 also includes an LO signal input port 60 at which the signal from the local oscillator is input. Input port 60 is differentially connected to four PMOS transistor devices 62, 64, 66, 68 and defines the LO input branch, where one side of the LO port 60 is connected to the gates of devices 64 and 66, and the other side of the input port 60 is connected to the gates of devices 62 and 68. The sources of devices 62 and 64 are connected to the drain of NMOS device 56 as shown, and the sources of devices 66 and 68 are connected to the drain of NMOS device 54 as shown.

The drains of devices 62, 64, 66, and 68 function as a differential output for the mixer 50, where the drains of devices 62 and 66 are connected together to provide one positive output node $OUT_P$, and the drains of devices 64 and 68 are connected together to provide the negative output node $OUT_N$.

The output load of the mixer 50, which is connected to the output nodes $OUT_P$ and $OUT_N$, is implemented in the described embodiment as an active load including two NMOS transistor devices 72 and 74 and which operate as current sources. The drain of device 72 is connected to the output node $OUT_P$, and the drain of device 74 connected to output node $OUT_N$. A voltage biasing node $V_B$ is provided at the interconnected gates of the devices 72 and 74 and the sources of the devices 72 and 74 are connected to ground. A bias voltage V2 is applied at the node $V_B$. In other embodiments, a passive load can be connected to the output nodes $OUT_P$ and $OUT_N$ instead of active devices 72 and 74, e.g., resistors and/or capacitors. However, the output signal is typically at a lower voltage level when using passive devices and may have to be amplified to a greater degree in later stages after the mixer.

A common mode sensing circuit is provided with resistors 80 and 82 which are connected in series between the output ports $OUT_P$ and $OUT_N$. The resistors 80 and 82 extract the average of the positive ($OUT_P$) and the negative ($OUT_N$) outputs, at the node $V_{CM}$ between the two resistors. The $V_{CM}$ node is connected to one input of an amplifier 84, where the other input of the amplifier 84 is connected to a predefined bias voltage $V_C$. Thus, the common mode voltage $V_{CM}$ is compared to the bias voltage $V_C$. The compared Output of the amplifier 84 is connected to the gates of PMOS transistor devices 90 and 92, which have sources connected to a VDD voltage and drains connected to the drains of devices 54 and 56, respectively. Thus, the compared output of amplifier 84 drives the PMOS devices 90 and 92 which act as current sources for the mixer. The negative feedback provided by the amplifier 84 sets the DC output voltage of the circuit to the bias voltage $V_C$. The current sources 90 and 92 minimally load the devices of the mixer (as compared with other components such as resistors), and thus steal minimal current from the RF signal.

In operation, the mixer 50 receives the oscillating RF signal which causes the current to flip-flop back and forth between the two devices 54 and 56. This causes the devices 62 and 68 at one time to be open when devices 64 and 66 are closed, and at alternating times devices 62 and 68 to be closed while devices 64 and 66 are open. The switching (or biasing) of the devices 62-68 occurs back and forth at a rate determined by the frequency of the LO signal. These switches direct the AC currents of the LO from devices 54 and 56 to the active output load of devices 72 and 74, half the time to one output node $OUT_P$, and half the time to the other output node $OUT_N$. This non-linear process causes mixed product signals at the output nodes having frequencies approximately the sum of the RF and LO frequencies, and approximately the difference of the RF and LO frequencies. One of these signals can be used as the mixed output signal having the desired down-converted intermediate frequency (i.e., when the mixer is used as a down-conversion mixer).

The common mode (average) voltage at node $V_{CM}$ is compared to the bias voltage $V_C$. The compared output of the amplifier 84 drives the PMOS devices 90 and 92 which act as current sources for the mixer. The negative feedback provided by the amplifier 84 accurately sets the DC output voltage at nodes $OUT_P$ and $OUT_N$ to the bias voltage $V_C$.

With this configuration, the bias current of each branch can be set independently. The bias current of the RF branch is determined by V1, Which is the DC voltage at the RF port 52, while the bias current of the LO branch is determined by V2, which is the DC voltage at the node $V_B$. These two bias voltages V1 and V2 are independent of each other, and can be controlled or tuned as desired to tune the performance of the mixer. This independent bias voltage control of the present invention allows higher performance to be achieved and lowers the distortion produced by devices 54 and 56 while allowing the output noise resulting from the switching action at the devices 21-24 that receive the LO signal to be avoided. The present invention allows independent control of mixer characteristics such as conversion gain, linearity, and noise.

For example, in prior art mixer devices, the mixer could not be tuned to increase its linearity by, for example, 2 dB without having, to decrease the noise figure of the mixer by, for example, 2 dB. In the present invention, an increase in linearity and noise figure can both be achieved by independently controlling the bias currents to achieve this performance. For example, in general, the bias voltage V1 can be increased by a particular amount to increase the bias current in the RF branch and the linearity of the mixer at a particular RF frequency, while the bias voltage V2 can be decreased by a particular amount so that the noise figure does not lower. This relationship may also depend on the characteristics of the components of the circuit. Conversion gain depends on the current that flows at both branches. To maximize conversion gain, therefore, the bias current in the input RF branch can be increased and the bias current in the output branch can be decreased. The dynamic range of the mixer is the ratio of the maximum output signal that can be produced by the mixer to the noise that the circuit itself produces at the output. Thus, the dynamic range is tunable in the mixer of the present invention by adjusting or tuning the above-described characteristics.

The independent bias control described above is very suitable for multi-band implementations and applications of the mixer 50. This is because the performance of the mixer 50 can be controlled or tuned for different RF signal frequencies that may be received by the mixer. For example, the RF signal at the input port 52 might be 5 GHz at particular times, and 2.5 GHz at other times (depending, for example, on different frequency bands fed to the mixer in a receiver which includes the mixer 50). When the RF signal is 5 GHz, the noise performance is important, so that the noise figure of the mixer can be decreased by increasing the current in the RF branch by increasing the bias voltage V1. The bias voltage V2 can be lowered by a specific amount that lowers the noise introduced by the LO branch while preventing the devices from introducing too much distortion. When the RF signal is 2.5 GHz, the linearity of the mixer may be desired to be increased, so that the bias current can be increased in the RF branch and increased by a smaller amount in the LO branch to prevent the noise figure from lowering.

The conversion gain, noise, linearity and output voltage of the mixer can be controlled and set independently to absorb process tolerances. This is especially relevant when the mixer 50 is used in digitally-calibrated receivers, where the mixer performance can be measured and calibrated.

Furthermore, the use of PMOS devices in the mixer of the present invention results in improved noise performance since PMOS devices exhibit superior flicker noise behavior compared to NMOS devices.

Figure 3:
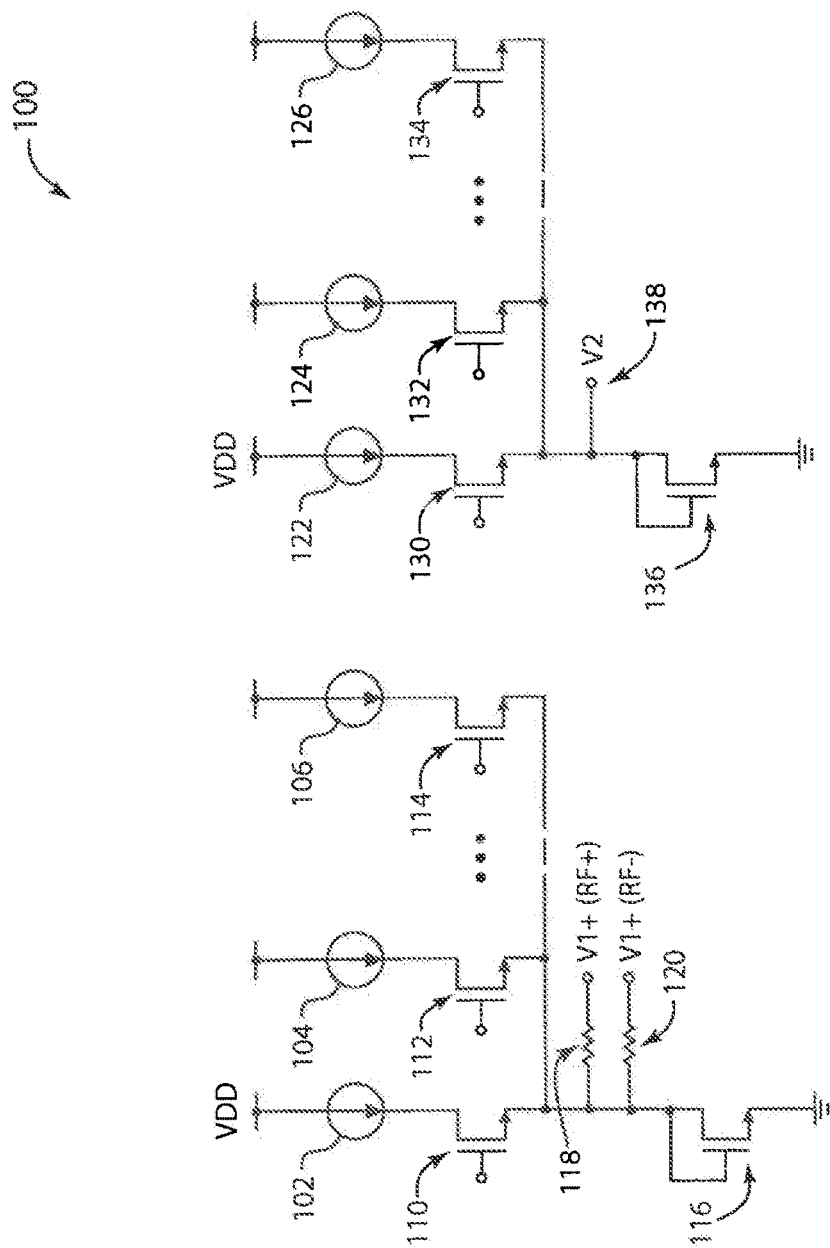
FIG. 3 is a schematic diagram illustrating a bias circuit suitable for use with a mixer of the present invention.

FIG. 3 is a schematic diagram illustrating an example of a bias circuit 100 suitable for use with the mixer 50 of the present invention shown in FIG. 2. This circuit 100 can be used to supply the bias voltages V1 and V2 used in the mixer 50 of FIG. 2 or the mixer 150 of FIG. 4 (described below).

As explained above, the dynamic range of the mixer of the present invention can preferably be tuned to the desired range. This tuning can be accomplished by changing the bias current that flows at the RF branch including devices 54 and 56, and at the LO output branch including devices 62, 64, 66, 68, 72, and 74. To control the bias current in a continuous (analog) way, two continuous voltages (analog values) V1 and V2 are applied, as explained above with reference to FIG. 2. To control the continuous voltages in a discrete or digital way, the bias circuit 100 of FIG. 3 can be used. A digital control over the bias voltages might be appropriate if the mixer 50 is being used in a system having a digital interface, where the current would be controlled with off and on signals rather than set using an analog value. The current sources can be digitally-weighted (e.g., one provides current I, others provide 2I, 4I, 8I, etc.), or have discrete values (e.g., I, 1.5I, 10I, etc.).

Bias circuit 100 can include two or more current sources. One portion of the circuit biases the voltage V1 for the RF branch in the mixer 50. For example, current sources 102, 104, and 106, as shown in FIG. 3, are used for the digital control of bias voltage V1. Current source 102 is connected to NMOS transistor device 110, current source 104 is connected to NMOS transistor device 112, and current source 106 is connected to NMOS transistor device 114. If additional current sources are being used, each one is similarly connected to an NMOS device.

The sources of NMOS devices 110, 112, and 11 are connected together and are connected to a diode-connected transistor 116 which is connected to ground. Two resistors 118 and 120 are connected at one end to the node between the transistor 116 and the devices 110, 112, and 114. At the other connection of each resistor 118 and 120 is a terminal that is connected to a corresponding terminal of the RF signal port 52 of mixer 50, where resistor 118 is connected to the positive RF terminal, and resistor 120 is connected to the negative RF terminal.

The other part of the bias circuit provides the bias voltage V2 to the output (LO) branch of the mixer 50. Current sources 122, 124, and 126, as shown in FIG. 3, can be used for the digital control of bias voltage V2. Current source 122 is connected to NMOS transistor device 130, current source 124 is connected to NMOS transistor device 132, and current source 126 is connected to NMOS transistor device 134. If additional current sources are being used, each one is similarly connected to an NMOS device.

The sources of NMOS devices 130, 132, and 134 are connected together and are connected to a diode-connected transistor 136, which is connected to ground. A terminal 138 is provided between transistor 136 and devices 130-134, where terminal 138 provides voltage V2 and is connected to the corresponding V2 terminal of mixer 50.

In operation, the bias circuit 100 provides bias voltages dependent on the selections of the switching devices 102-106 and 122-126. To control the bias current in a discrete way, the current sources 102-106 and 122-126 can have predetermined values, e.g., I1=0.1 mA, I2=3 mA, and I3=1.5 mA. To control the bias in a digital way, the current sources 102-106 can be digitally weighed. For example, current source 102 can source a current of I, current source 104 can source a current of 2I, and current source 106 can source a current of 4I. The NMOS devices 110-114 and 130-134 are used as switches by setting their gate voltage low or high, thus controlling the applied current at devices 116 and 136, respectively. The desired amount of applied current from the selected sources is combined together from the selected sources and passes to device 116 or 136.

Diode-connected transistor 116 mirrors the applied current from sources 102-106 to the RF input 52 and at the input transistors 54 and 56 of the mixer 50. Transistor 136 mirrors the applied current from the selected sources 122-126 to the node $V_B$ and at devices 72 and 74 and the switching devices 62-68 of the mixer 50. Thus, the voltage bias V1 and V2 can be controlled independently using bias circuit 100.

Figure 4:
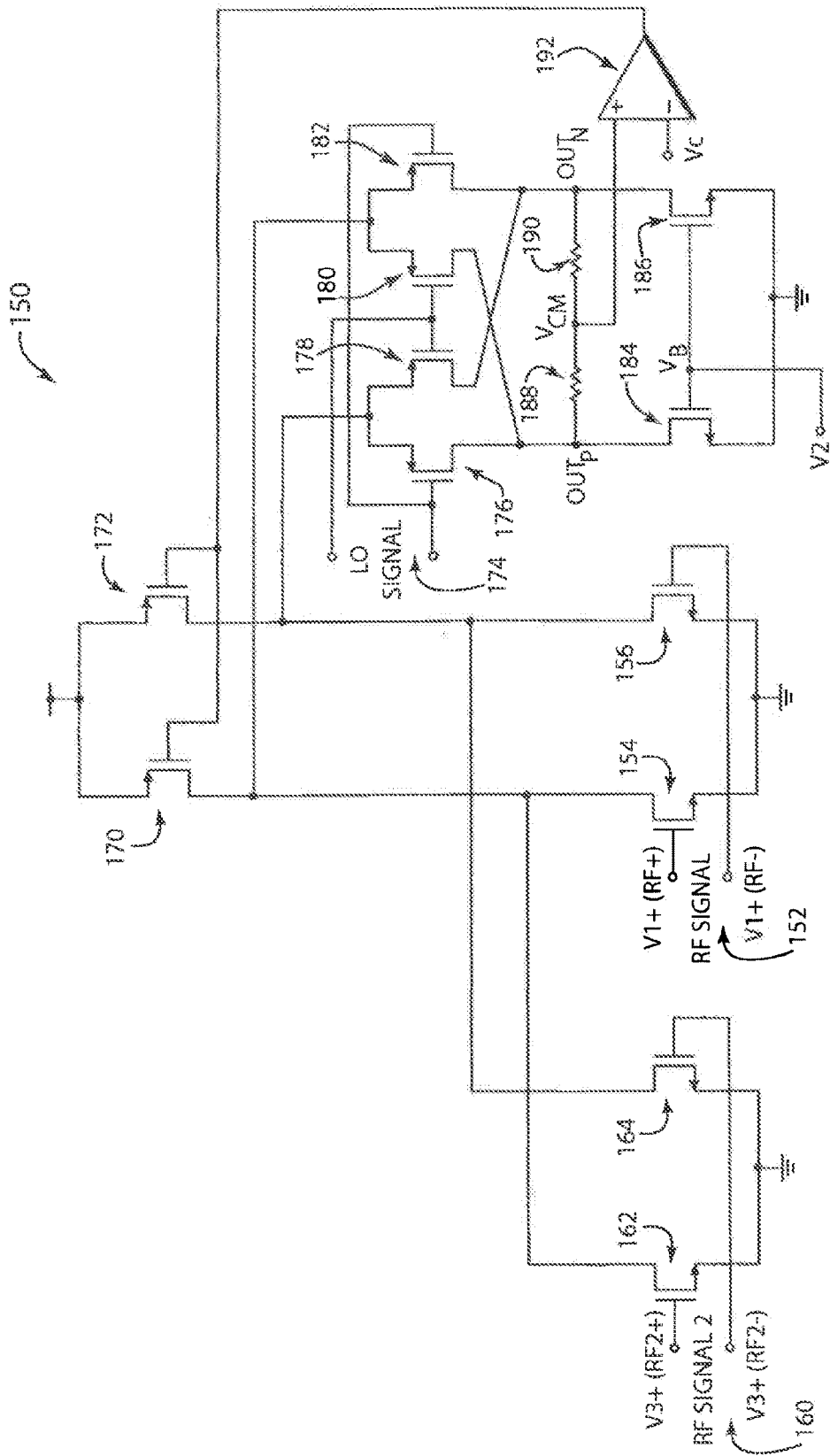
FIG. 4 is a schematic diagram illustrating another embodiment of the mixer of the present invention, in which an RF switch is used to select between multiple RF signals.

FIG. 4 is a schematic diagram illustrating a mixer 150 that is similar to the mixer 50 of FIG. 2 and also includes an RF switch to allow different RF input signals to be input to the mixer 150. The dynamic range control and the applicability of the mixer 50 in terms of frequency range can be further improved when the RF switch is combined with the mixer 50.

The mixer 150 includes two RF input stages that can allow one of two RF signals to be input to the mixer 150. RF input port 152 is similar to the RF input port 52 of the mixer 50, where the positive RF signal is connected to NMOS device 154, and the negative RF signal is connected to NMOS device 136.

A second RF input port 160 is included, which can receive a second RF signal ("RF signal 2") that is different from the RF signal of port 152. RF signal input port 160 is differentially connected to the gates of NMOS devices 162 and 164, where the positive RF input is connected to device 162, and the negative RF input is connected to device 164. The devices 162 and 164 are connected to ground at their sources and their drains are connected to the drains of devices 154 and 156 of the first RF input port 152.

A bias voltage V3 is applied at the RF input port 160 to set the level of bias current in the second RF input branch (V3 is a DC bias voltage, independent of the AC voltage of the RF signal 2). V3 can be provided by a bias circuit similar to bias circuit 100 or by any type of appropriate bias source.

The devices 154 and 156 of the first RF branch and the devices 162 and 164 of the second RF branch are both connected to the PMOS devices 170 and 172, which act similarly to the devices 90 and 92 of FIG. 2. Furthermore, the remainder of the circuit of the mixer 150 is similar in configuration and function to the mixer 50, where an LO input port 174 provides the LO signal to switching PMOS devices 176, 178, 180, and 182, and the active load is made up of NMOS devices 184 and 186. Bias voltage V2 is applied to node $V_B$ which is at the gates of devices 184 and 186, while a common mode voltage $V_{CM}$ is between resistors 188 and 190 and the output ports OUTP and OUTN, respectively. Amplifier 197 compares VCM to a predefined bias voltage $V_C$. The operation of this circuit is similar to that of FIG. 2.

The RF switch operates by selecting one of the two RF input signals to be input to the mixer. One way to select this is to control one of the bias voltages V1 and V3 to be zero, which causes the RF signal at that input to be zero (switched off), and control the other bias voltage to be its normal non-zero value, allowing its RF signal through to the mixer (switched on). Other types of switching arrangements can be used in other embodiments.

Other characteristics can be modified in mixer 150 to allow more flexibility to the tunability of the mixer. For example, one pair of the devices 162/164 and 154/156 can be made physically smaller than the other pair, e.g., smaller in width-to-length ratio as implemented on an integrated circuit die. If a higher RF frequency is input, the smaller pair of devices can be switched to (while the other device pair and RF input is turned off) and is operated at a higher bias current as compared to the other pair of devices, allowing the mixer 150 to be used at the higher RF frequencies with better linearity while maintaining high gain than if the larger pair of devices were being used.

The above-described RF switching scheme is scalable in other embodiments, where any number of RF inputs can be provided using more switches in parallel. Thus, the RF signal input port and transistor device pair that was desired to be used would receive the desired bias voltage, while all the other RF inputs would receive a zero bias voltage.

Any applicable control method can be used for switching between RF inputs. For example, in one embodiment, the switching can be automatically performed by a controller, such as a control circuit or microprocessor, based on the detected frequency of the RF signal. In some embodiments, the switching can be controlled by a user of a device in which the mixer is provided.

Although the present invention has been described in accordance with the embodiments shown, one of ordinary skill in the art will readily recognize that there could be variations to the embodiments and those variations would be within the spirit and scope of the present invention. The techniques of the present invention can be applied to many types of alarms and similar conditions. Accordingly, many modifications may be made by one of ordinary skill in the art without departing from the spirit and scope of the appended claims.

What is claimed is:

1. A mixer apparatus, comprising:
   a first plurality of transistors, including a pair of n-type metal oxide semiconductor (NMOS) transistors, configured to receive a radio frequency (RF) signal and to provide a mixer input signal;
   a second plurality of transistors configured to frequency translate the mixer input signal with a local oscillator (LO) signal to provide an intermediate frequency (IF) signal; and
   a comparator configured to compare a common mode voltage of the IF signal to a reference voltage to provide a sensing signal,
   wherein the first plurality of transistors further includes a pair of p-type metal oxide semiconductor (PMOS) transistors configured to provide a mixer input current based on the sensing signal to drive the common mode voltage to substantially equal the reference voltage.

2. The mixer apparatus of claim 1, further comprising:
   a second pair of NMOS transistors coupled to the pair of NMOS transistors, the second pair of NMOS transistors being configured to receive a second RF signal, wherein the pair of NMOS transistors and the second pair of NMOS transistors are configured to provide either the RF signal or the second RF signal as the mixer input signal.

3. The mixer apparatus of claim 1, wherein the first plurality of transistors includes a first current source configured to provide the mixer input current, and
   wherein the second plurality of transistors includes a second current source, the second current source being configured to provide a mixer output current, and wherein the second plurality of transistors is further configured to adjust the common mode voltage based on variations in the mixer output current.

4. The mixer apparatus of claim 1, further comprising:
a first plurality of switches coupled to a first plurality of corresponding current sources;
a second plurality of switches coupled to a second plurality of corresponding current sources; and
first and second diode-connected transistors, each of the first and second diode-connected transistors being coupled to each switch from among the plurality of switches,
wherein the first plurality of switches is configured to selectively couple each current source from among the first plurality of current sources to the first diode-connected transistor,
wherein the second plurality of switches is configured to selectively couple each current source from among the second plurality of current sources to the second diode-connected transistor, and
wherein the first and second diode-connected transistors are further configured to provide first and second bias voltages, respectively.

5. The mixer apparatus of claim 4, wherein the first plurality of transistors is further configured to adjust a bias current level of the RF signal using the first bias voltage, and
wherein the second plurality of transistors is further configured to adjust the common mode voltage using the second bias voltage.

6. The mixer apparatus of claim 4, wherein the first plurality of current sources and the second plurality of current sources comprise:
weighted current sources.

7. The mixer apparatus of claim 1, further comprising:
a first bias circuit configured to provide a first bias voltage to said first plurality of transistors, and a second bias circuit configured to provide a second bias voltage to said second plurality of transistors, said first and second bias voltages determined to independently adjust respective first and second mixer characteristics that are different from each other.

8. The mixer apparatus of claim 7, wherein the first bias voltage is adjusted to increase a first bias current in the first plurality of transistors to effect the first mixer characteristic, and the second bias voltage is adjusted to decrease a second bias current in the second plurality of transistors to effect the second mixer characteristic, and wherein the first mixer characteristic is gain and the second mixer characteristic is noise figure.

9. A mixer apparatus, comprising:
a first plurality of transistors configured to receive a radio frequency (RF) signal and a first bias voltage to provide a mixer input signal having an RF bias current;
a second plurality of transistors configured to provide a mixer input current; and
a third plurality of transistors configured to frequency translate the mixer input signal with a local oscillator (LO) signal to deliver an intermediate frequency (IF) signal to a load having a common mode voltage,
wherein the load is configured to adjust the common mode voltage based on a second bias voltage, the load including a pair of transistors having their gate electrodes coupled to one another and to a biasing device, the biasing device being configured to supply the second bias voltage, and the pair of transistors being configured to adjust the common mode voltage in response to the second bias voltage,
wherein the first plurality of transistors is further configured to adjust the RF bias current based on the first bias voltage, and
wherein the second plurality of transistors is further configured to adjust the mixer input current based on the common mode voltage.

10. The mixer apparatus of claim 9, further comprising:
a comparator configured to compare the common mode voltage to a reference voltage to provide a sensing signal, and
wherein the second plurality of transistors is further configured to adjust the mixer input current based on the sensing signal.

11. The mixer apparatus of claim 10, wherein the second plurality of transistors is further configured to provide the mixer input current to drive the common mode voltage to substantially equal the reference voltage.

12. The mixer apparatus of claim 9, wherein the biasing device comprises:
a plurality of switches coupled to a plurality of corresponding current sources; and
a diode-connected transistor coupled to each switch from among the plurality of switches,
wherein the plurality of switches is configured to selectively couple each current source from among the plurality of current sources to the diode-connected transistor, and
wherein the diode-connected transistor is further configured to provide the second bias voltage.

13. The mixer apparatus of claim 12, wherein the biasing device is from among a plurality of biasing devices, and wherein a second biasing device from among the plurality of biasing devices is further configured to provide the first bias voltage.

14. The mixer apparatus of claim 9, further comprising:
a fourth plurality of transistors coupled to the first plurality of transistors, the fourth plurality of transistors being configured to receive a second RF signal, wherein the first plurality of transistors and the fourth plurality of transistors are configured to provide either the RF signal or the second RF signal as the mixer input signal.

15. A mixer apparatus, comprising:
a plurality of n-type metal oxide semiconductor (NMOS) transistors configured to receive a radio frequency (RF) signal and to provide a mixer input signal;
a plurality of p-type metal oxide semiconductor (PMOS) transistors coupled to the plurality of NMOS transistors, the plurality of PMOS transistors being configured to frequency translate the mixer input signal with a local oscillator (LO) signal to provide an intermediate frequency (IF) signal having a common mode voltage;
a first current source coupled to the plurality of NMOS transistors, the first current source being configured to provide a mixer input current based on the common mode voltage; and
a second current source coupled to the plurality of PMOS transistors, the second current source being configured to provide a mixer output current and to set the common mode voltage to substantially equal a reference voltage by adjusting the mixer output current.

16. The mixer apparatus of claim 15, further comprising:
a comparator configured to compare the common mode voltage to the reference voltage to provide a sensing signal, and
wherein the first current source is further configured to adjust the mixer input current based on the sensing signal.

17. The mixer apparatus of claim 15, wherein the plurality of NMOS transistors is coupled to a first biasing device, the first biasing device being configured to supply a first bias voltage and to bias the RF signal with the first bias voltage to provide the mixer input signal, and wherein the second current source comprises:
   a pair of transistors having their gate electrodes coupled to one another and to a second biasing device, the second biasing device being configured to supply a second bias voltage, and to adjust the common mode voltage in response to variations in the second bias voltage.

18. The mixer apparatus of claim 17, wherein the second current source is further configured to adjust the mixer output current based on the second bias voltage.

19. The mixer apparatus of claim 17, wherein the first and second biasing devices comprise:
   a plurality of switches coupled to a plurality of corresponding third current sources; and
   a diode-connected transistor coupled to each switch from among the plurality of switches,
   wherein the plurality of switches is configured to selectively couple each third current source from among the plurality of third current sources to the diode-connected transistor, and
   wherein the diode-connected transistor is configured to provide the first bias voltage and the second bias voltage.

20. The mixer apparatus of claim 19, wherein the plurality of corresponding third current sources comprise:
   weighted current sources.

\* \* \* \* \*